US006297649B1

(12) United States Patent
Tsironis

(10) Patent No.: US 6,297,649 B1
(45) Date of Patent: Oct. 2, 2001

(54) HARMONIC REJECTION LOAD TUNER

(75) Inventor: Christos Tsironis, Kirkland (CA)

(73) Assignee: Focus Microwaves Inc., Quebec (CA)

(*) Notice: Subject to any disclaimer, the term of this patent is extended or adjusted under 35 U.S.C. 154(b) by 0 days.

(21) Appl. No.: 09/409,554

(22) Filed: Sep. 30, 1999

(51) Int. Cl.$^{7}$ .............................. G01R 27/04; H01P 1/00

(52) U.S. Cl. .......................... 324/642; 324/629; 324/637; 333/248

(58) Field of Search .................................... 324/642, 754, 324/534, 629, 636, 637; 333/202, 205, 206–212, 246, 33, 248

(56) References Cited

U.S. PATENT DOCUMENTS

| | | | |
|---|---|---|---|
| 3,613,035 | 10/1971 | Askew | 333/84 M |
| 3,697,902 | 10/1972 | Louvel | 333/84 M |
| 4,262,266 | 4/1981 | Chern | 333/33 |
| 4,535,307 * | 8/1985 | Tsukii | 333/35 |
| 4,697,159 | 9/1987 | Sechi et al. | 333/24 C |
| 5,017,865 | 5/1991 | Oldfield | 324/158 F |
| 5,115,217 | 5/1992 | McGrath et al. | 333/246 |
| 5,276,411 | 1/1994 | Woodin, Jr. et al. | 333/22 R |

FOREIGN PATENT DOCUMENTS

| | | |
|---|---|---|
| 0381398 | 8/1990 | (EP) . |
| 2100526 | 12/1982 | (GB) . |

OTHER PUBLICATIONS

"A load Pull System for Digital Mobile Radio Power Amplifiers", ATN Microwave Inc. Product Feature, Published in Microwave Journal, pp. 116–118, Mar. 1995.*

New Programmable Harmonic Tuners, Wireless Product Digest, Feb. 1999, p. 70–71, Focus Microwaves.

An Improved Coaxial Coupler for Measurement of the Microwave Hall Effect, 8127 Review of Scientific Instruments 62 (1991) Dec., No. 12, New York, US, p. 3089–3091, A. Y. Al Zoubi, T. E. Cross, and D. A. Mohamed Isa.

A Load Pull System with Harmonic Tuning, Microwave Journal, Mar. 1996, p. 128, 130 & 132, ATN Microwave Inc.

A Load Pull System for Digital Mobile Radio Power Amplifiers, Microwave Journal, Mar. 1995, p. 116 & 118, ATN Microwave Inc.

An Affordable Harmonic Load Pull Setup, Microwave Journal, Oct. 1998, p. 180–182, Focus Microwaves Inc.

* cited by examiner

*Primary Examiner*—Safet Metjahic
*Assistant Examiner*—Anjan K Deb
(74) *Attorney, Agent, or Firm*—Kramer Levin Naftalis & Frankel, LLP.

(57) ABSTRACT

The present invention discloses a harmonic rejection load pull tuner. The tuner of the invention has a large-band tuner having an input and an output, and a transmission line having a longitudinal axis. The transmission line has an input connected to the output of a DUT and an output connected to the input of the large-band tuner. In parallel with the transmission line is at least one stub, the at least one stub having a length adapted to reflect out an nth order harmonic of a base frequency, where n is an integer greater than 1. The tuner of the present invention can be used to perform input or output characterisation (or both) of a DUT, by selectively reflecting out at least one harmonic frequency of the base frequency. Consequently, the characterisation of the DUT is improved, since the effects of the harmonics are considerably reduced. The present invention also concerns a method for performing input or output characterisation.

16 Claims, 14 Drawing Sheets

POUT & P.A.EFF (L/P)
F= 1.9000 GHz, NOAM.LPD

POUT Max = 17.91 dBm at 50.9 + j62.9
P.A.EFF Max = 9.63 % at 99.5 + j42.3

NOTE : THE REPRESENTED COAXIAL STUBS INCLUDE AN EXTERNAL GROUNDED CONDUCTOR AND AN INTERNAL CONDUCTOR ENDING IN THE SLIDING CONTACT TOUCHING THE CENTRAL CONDUCTOR OF THE MAIN COAXIAL LINE.

HARMONIC REJECTION LOAD TUNER

FIELD OF THE INVENTION

The present invention relates to a harmonic rejection load pull tuner. More particularly, the present invention concerns a RF or microwave tuning device which has the ability to create high reflection factors for frequencies in the MHz and GHz frequency range, in order to improve the measurement of the characteristics and the behaviour of devices under test (hereinafter referred to as "DUT"), such as high power transistors, multiplier diodes and other non-linear devices.

DESCRIPTION OF THE PRIOR ART

RF/microwave tuners are electronic or mechanical devices which modify in a predictable way or not the complex impedance seen by the DUT at a given frequency of operation. When the impedance (and consequently the reflection factor) presented to the DUT changes, so does the capability of the DUT to generate or amplify the signal injected to it. To perform a full characterisation of a DUT, the tuner is adjusted to sequentially and uniformly cover a great number of points all over the Smith chart (see FIG. 1).

This technique of subjecting DUTs to variable load (or source) impedance conditions, commonly referred to as "load pull", is used to test DUTs for amplifier, oscillator or frequency multiplier applications.

Load pull testing can be made using manually or automatically operated RF/microwave tuners. These tuners are connected to the input or output side of the DUT and the power or frequency processed by the DUT is measured as a function of the impedance generated by the tuner Appropriate plots (contours) of output power or frequency, or other desirable unit to be measured (see FIG. 2), then allow design engineers to construct networks that will cause the DUT to perform as expected in a real circuit.

There are a number of automatic and manual tuners in the RF and microwave frequency range presently available, such as the ones used in the measurement shown in FIGS. 3*a* and 3*b*. Most of these tuners covers a wide frequency range of operation, in general more than one octave ($f_{max}/f_{min}>2$). For these commercially available tuners, the impedances at the harmonic frequencies ($2f_o$, $3f_o$, etc.) are manipulated at the same time as the fundamental frequency $f_o$. This is an undesired phenomenon, because it does not give the test engineer (or the design engineer, as they can be the same person) the possibility to optimize the impedances at the harmonic frequencies independently of the fundamental frequency.

In order to obviate this problem, a number of sophisticated techniques have been developed to permit separation of the fundamental frequency from the harmonic frequencies. Among others, the use of frequency discriminators (diplexers, triplexers or multiplexers in combination with adjacent wideband tuners) and "active" load pull solutions have been proposed, which use amplifiers to overcome multiplexer losses. The most used and best known of the above techniques are: active harmonic load pull; active harmonic load pull-split method; and passive harmonic load pull method using a triplexer.

An active harmonic load pull system consists of a test fixture connected to an active load (AL) or a test fixture and a feedback loop (split method). In both cases, the signal returned to the output port of the DUT is generated by an amplifier and is of the same frequency and varying amplitude and phase as the signal injected into the DUT. FIG. 4 shows an active harmonic load pull system using active loads at the harmonic frequencies $f_o$, $2f_o$ and $3f_o$.

The DUT generates an output signal that contains the fundamental frequency $f_o$ and the harmonic frequencies $2f_o$ and $3f_o$. These three frequency components are extracted using a wideband coupler and amplified in three different filtered (F), phase controlled (Φ) and amplified (A) loops These signals are then re-injected into the output port of the DUT, generating a virtual load at all three harmonic frequencies. The disadvantage of this technique lies in the power limitation of the output amplifiers, the risk of parasitic oscillations during the test, and the impossibility to precalibrate the system. This last aspect implies "on-line" operation with a very expensive vector network analyser, and additional couplers and calibration standards must be added; consequently, the setup becomes very complex. Even though this technique is attractive from a theoretical point of view, it never became popular due to the practical disadvantages.

By contrast, in the split method illustrated in FIG. 5, the signal is split directly behind the source and before entering the DUT. Each frequency branch ($f_o$, $2f_o$ and $3f_o$) is amplified separately and the combined signal is injected into the output of the DUT. The amplitude and phase of each signal is controlled separately thus creating independently tunable impedances at the harmonic frequencies. The disadvantage of this method is that it loses its calibration when the input power is increased because each branch amplifier saturates differently than the DUT, so that the gain of the loop changes during a power sweep. Furthermore, this method requires a multitude of components and becomes awkward and uneconomical to build.

Finally, the passive harmonic load pull method using a triplexer is shown in FIG. 6. it consists of a test fixture and a triplexer at the output with three wideband tuners connected thereto. The disadvantage of this method lies in the losses of the triplexer and its limited frequency bandwidth. Parasitic reflections outside the operation frequency range may also cause parasitic oscillations in the DUT, making a test almost impossible.

SUMMARY OF THE INVENTION

It is an object of the invention to provide a harmonic rejection load pull tuner where at least one of the harmonic frequencies can be efficiently reflected. In accordance with the invention, this object is achieved with a harmonic load pull tuner comprising:

a large-bond tuner having an input and an output; and means for rejecting at least one harmonic frequency of a base frequency, said means having an input and an output, said input being connected to an output of a device under test (DUT) and said output being connected to the input of said large-band tuner.

In a preferred embodiment of the invention, the means for rejecting at least one harmonic frequency include a transmission line having a longitudinal axis and at least one stub in parallel with the transmission line, the stub having a length adapted to reflect out an nth order harmonic of a base frequency, where n is an integer greater than 1.

In another aspect of the invention, the means for rejecting at least one harmonic frequency of a base frequency are placed at the input of the DUT.

The invention also concerns a method for performing input characterization of a DUT, and a method for performing output characterization of a DUT.

BRIEF DESCRIPTION OF THE DRAWINGS

The present invention and its advantages will be more easily understood after reading the following non-restrictive description of preferred embodiments thereof, made with reference to the following drawings in which.

DESCRIPTION OF A PREFERRED EMBODIMENT OF THE INVENTION

Referring now to FIGS. 7 to 11 the present invention concerns a harmonic rejection load pull tuner which effectively reflects at least one of the harmonic frequencies.

Figure 1:
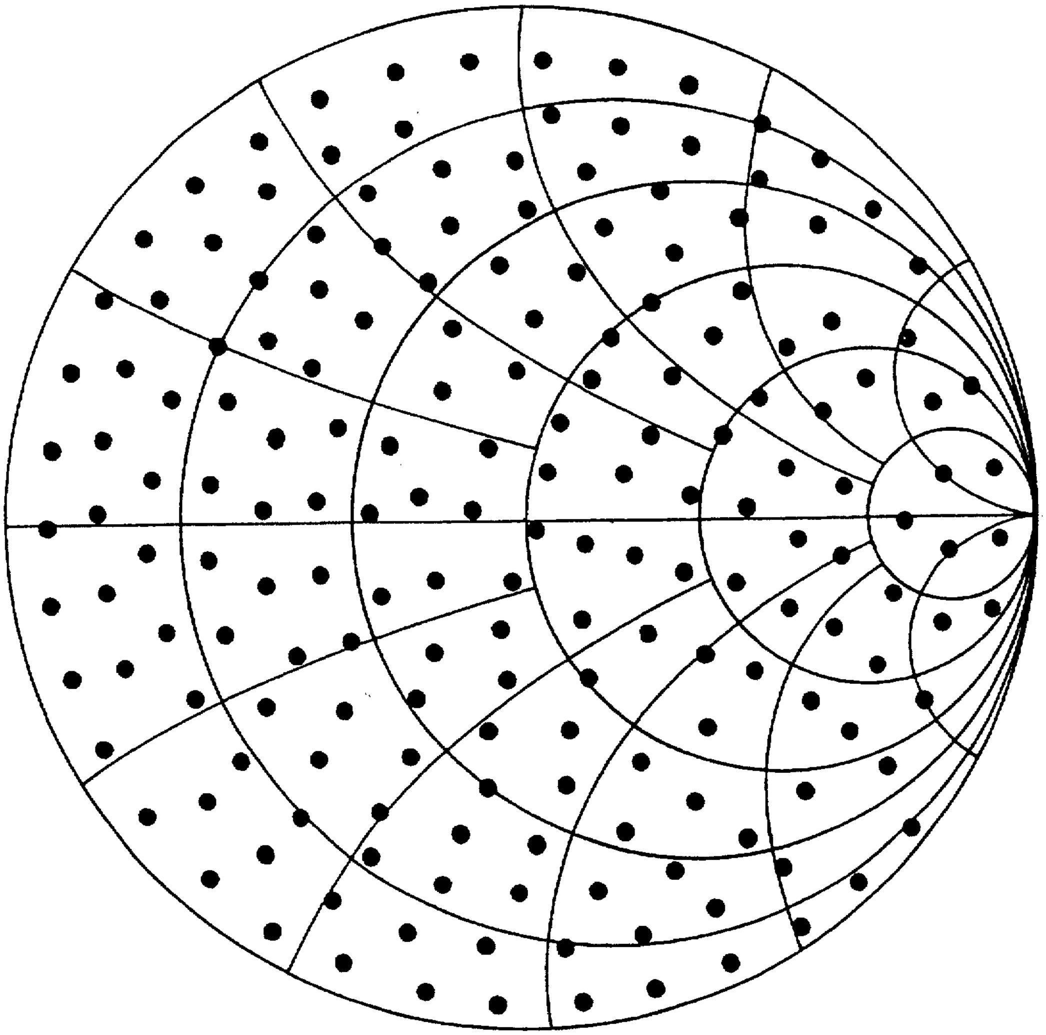
FIG. 1 is a representation of an example of impedance points covered on a Smith chart of a large-band tuner.
Figure 2:
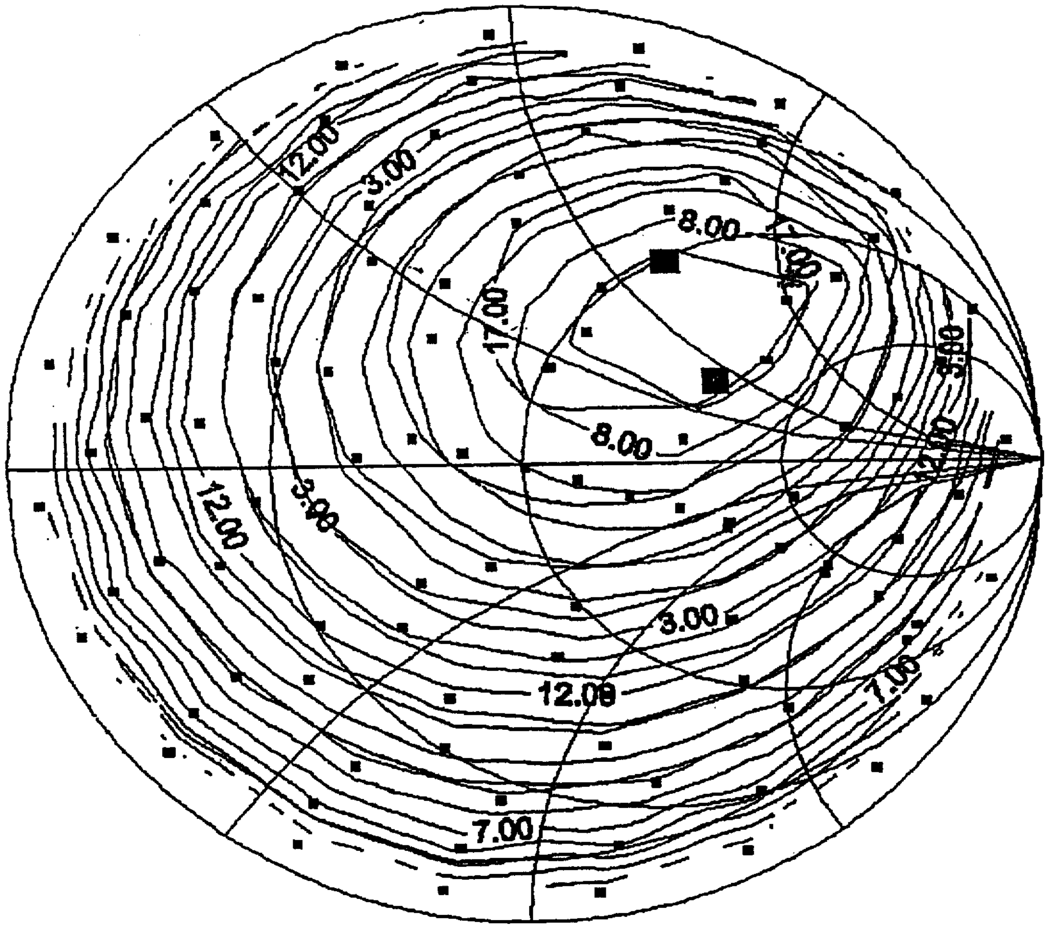
FIG. 2 is a representation of a number of points plotted on a Smith chart for the purpose of constructing a circuit for a given DUT.
Figure 3A:
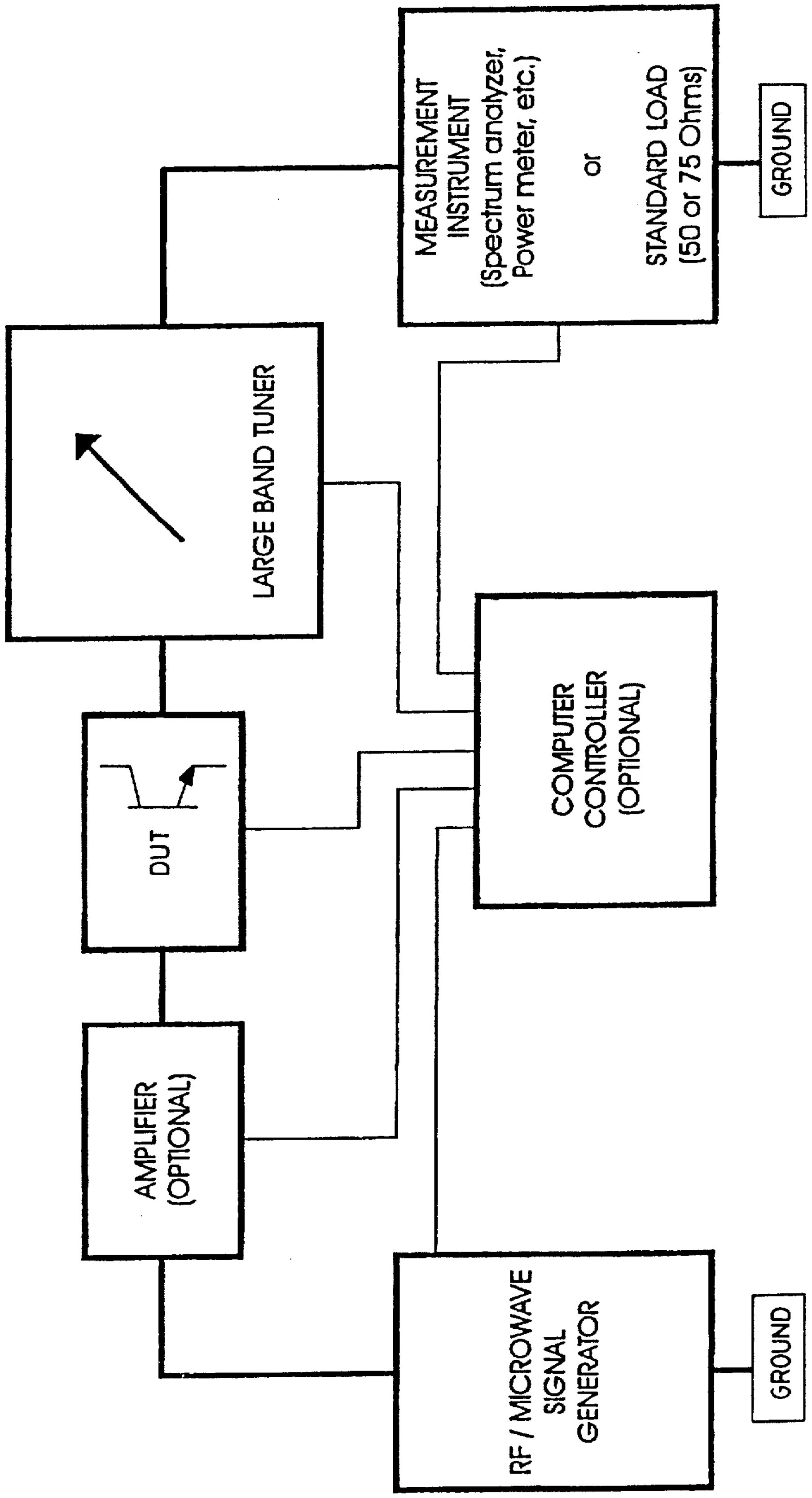
FIG. 3a is a schematic block diagram representation of a standard load pull set-up for DUT output characterisation, according to the prior art.
Figure 3B:
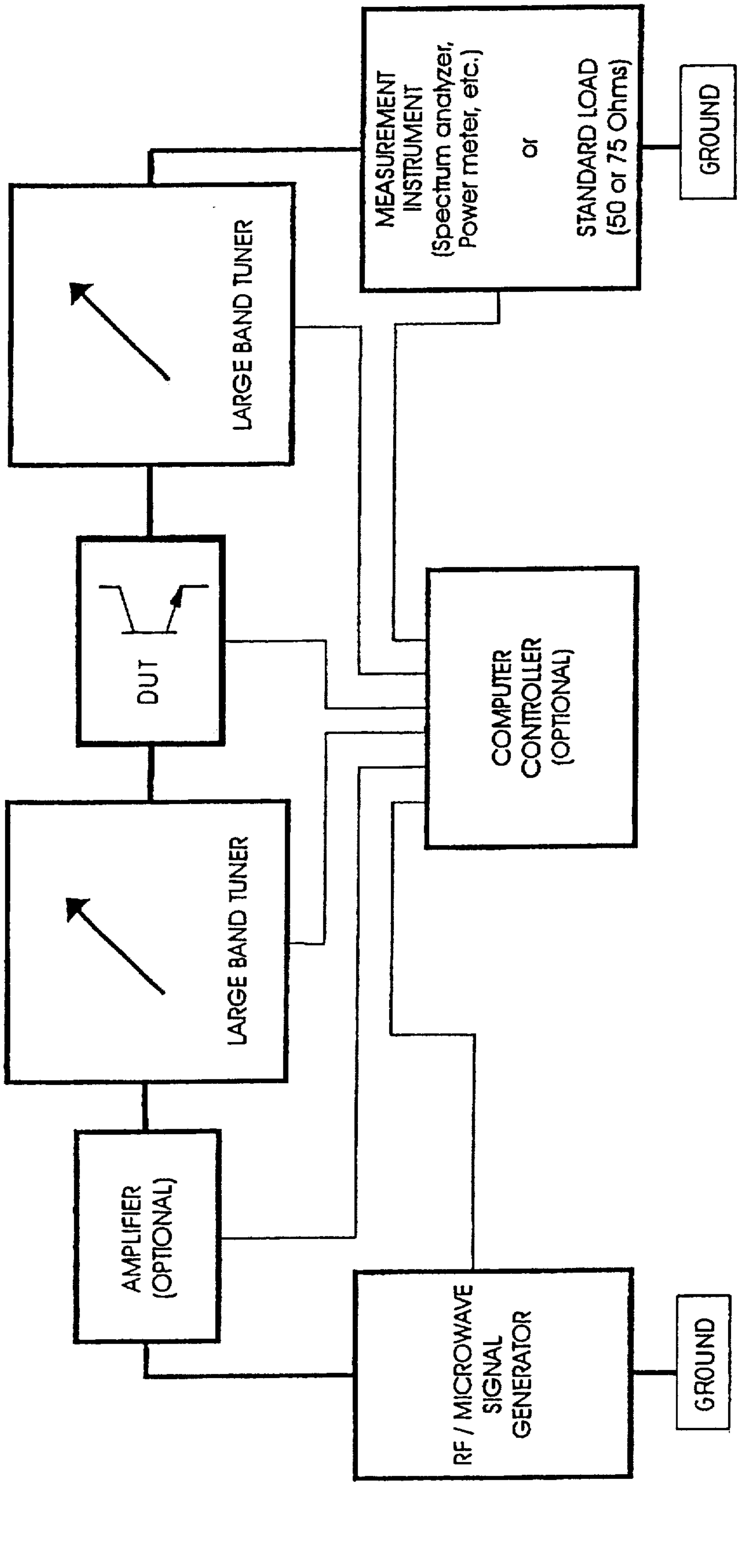
FIG. 3b is a schematic block diagram representation of a standard load pull set-up for DUT input and output characterisation, according to the prior art.
Figure 4:
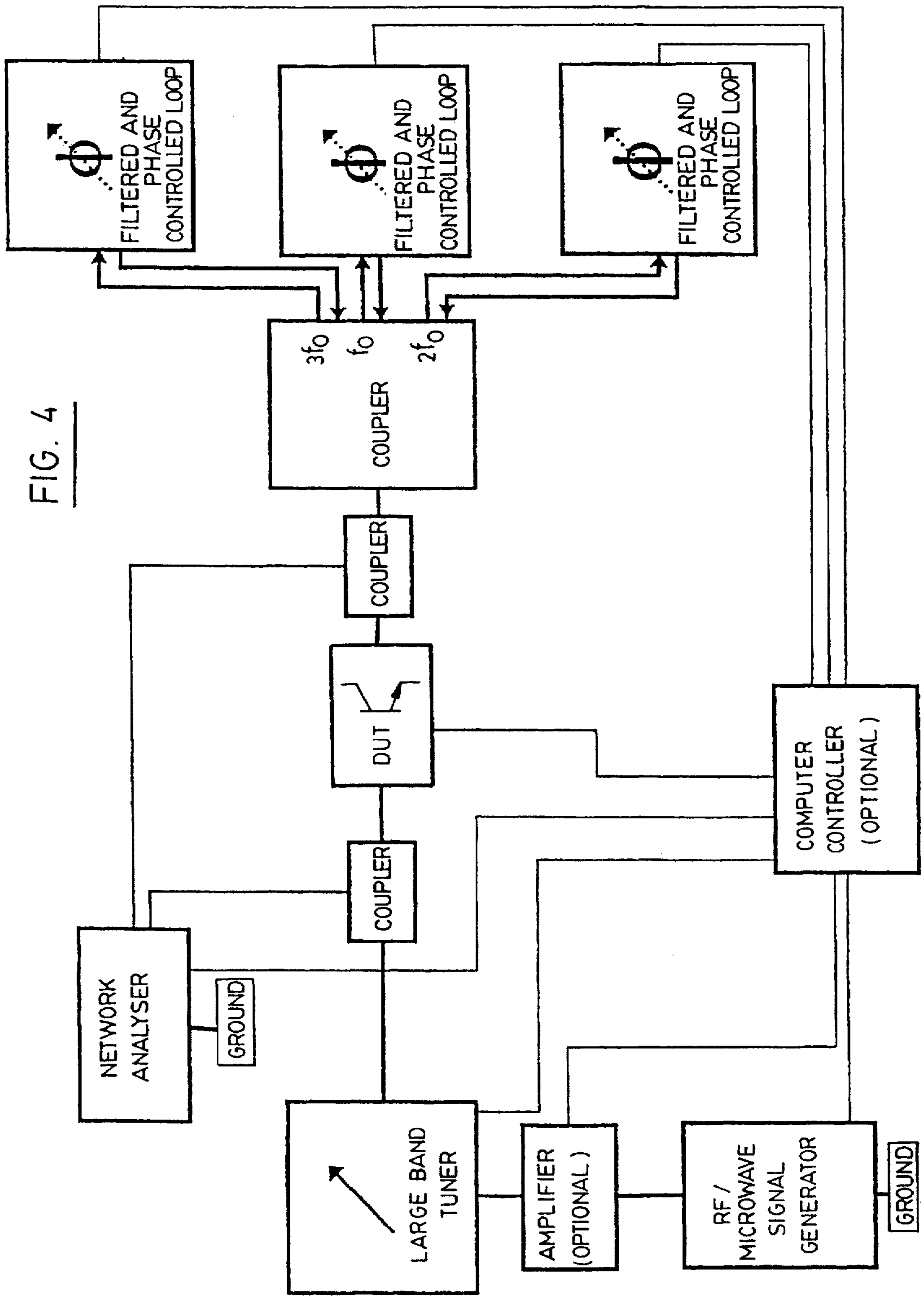
FIG. 4 is a schematic block diagram representation of an active load pull set-up for DUT output characterisation according to the prior art.
Figure 5:
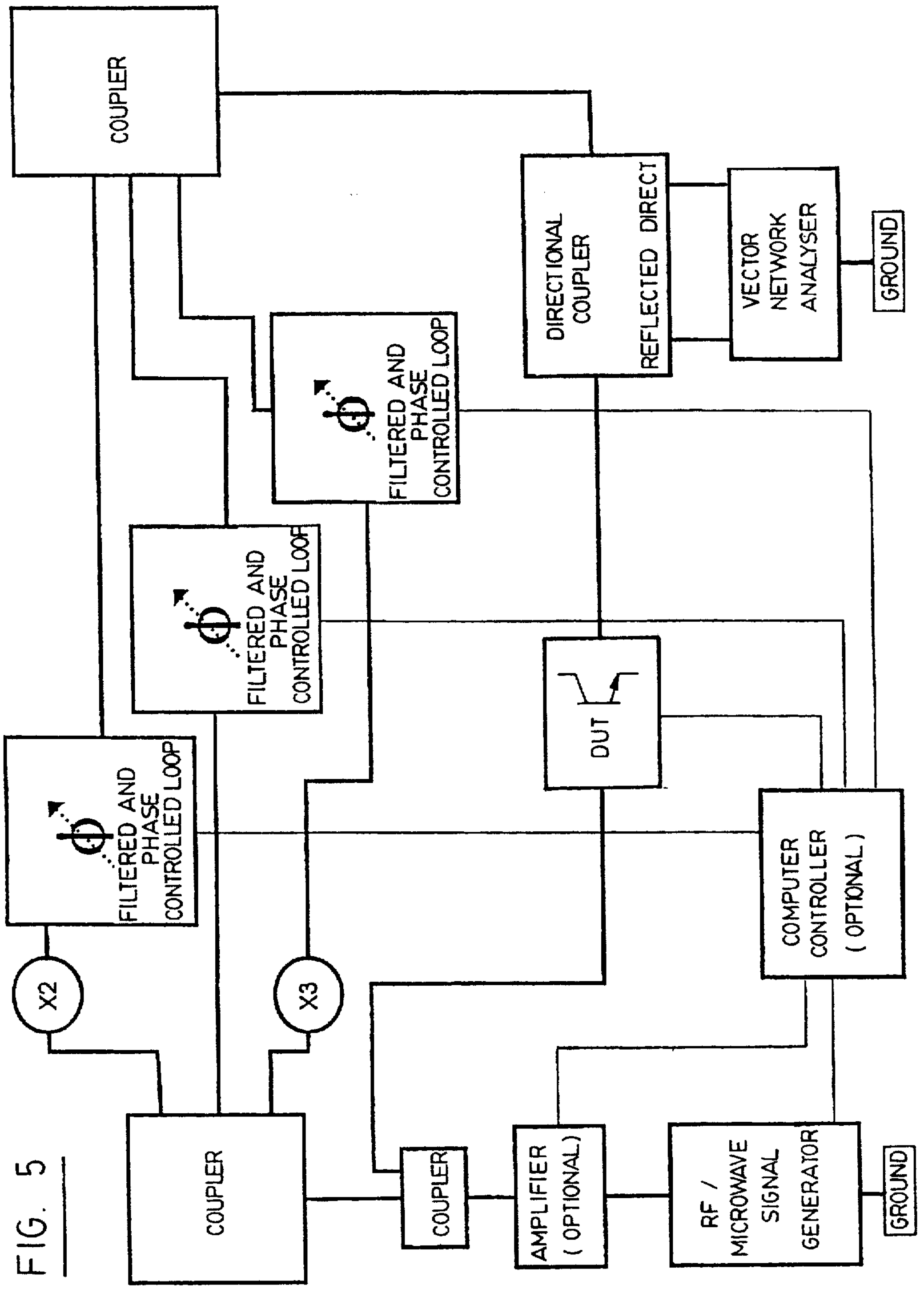
FIG. 5 is a schematic block diagram representation of an active load pull set-up for DUT output characterisation (split method) according to the prior art.
Figure 6:
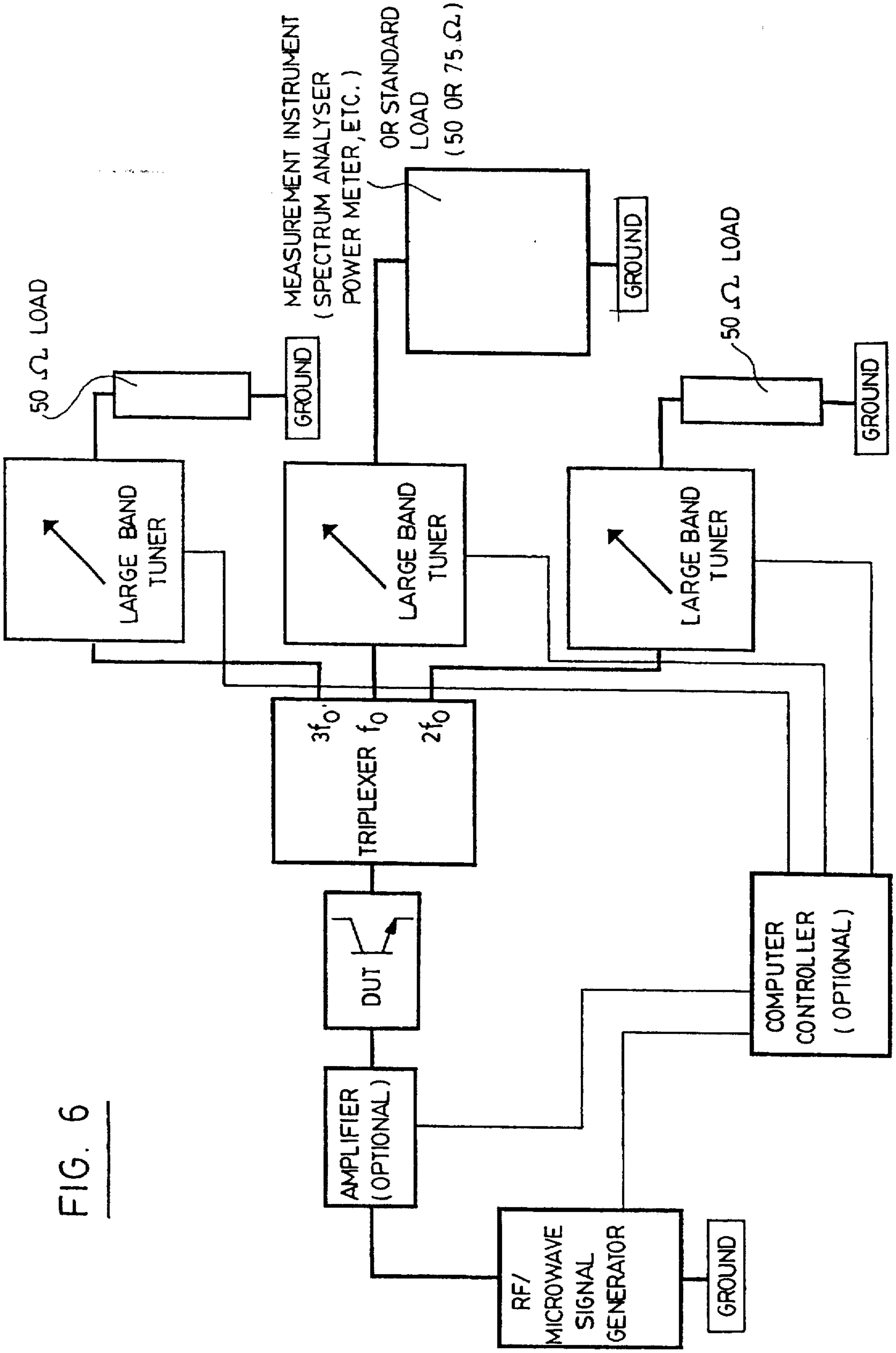
FIG. 6 is a schematic block diagram representation of a load pull set-up for DUT output characterisation with triplexer according to the prior art.
Figure 7:
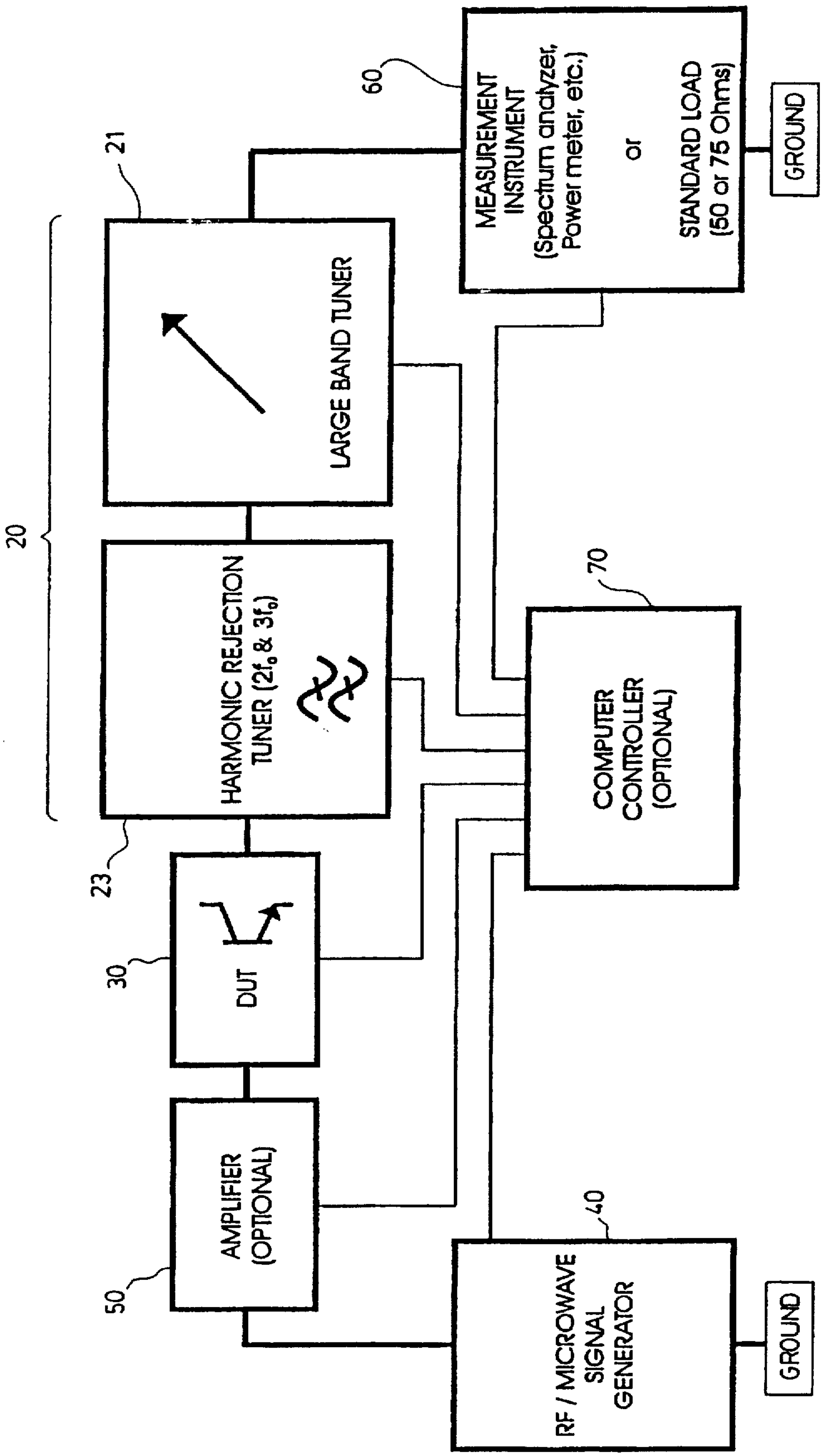
FIG. 7 is a schematic block diagram representation of a harmonic rejection load pull tuner according to a preferred embodiment of the invention.

In general, the present invention concerns a harmonic rejection load pull tuner 20 comprising: a large-band tuner 21 having an input and an output; and means 23 for rejecting at least one harmonic frequency of a base frequency, these means 23 having an input and an output, the input being connected to an output of a device under test (DUT) 30 and the output being connected to the input of the large-band tuner 21. FIG. 7 shows a complete set-up for output characterisation, where the set-up further includes a RF/microwave generator 40 whose output is optionally connected to an amplifier 50. The amplifier 50 (if present) is connected to the DUT 30, which is then connected to the input of the means 23 for rejecting at least one harmonic frequency of a base frequency, followed by a large band tuner 21, whose output can be applied to a measurement instrument 60, such as a spectrum analyzer, a power meter, etc., or to a standard load 60.

Preferably, in order to perform correct characterisation, the set-up illustrated in FIG. 7 is controlled by computer means 70 connected to each of the components, as the case may be.

In accordance with the invention, the means for rejecting at least one harmonic frequency must be inserted between a DUT and a large band tuner in order to generate controllable harmonic impedances before the large band tuners do this in an uncontrollable manner. The means 23 of the present invention will be useful only they present very high reflection factors at the harmonic frequencies, otherwise the harmonic waves will pass through and will be reflected by the large band tuner, in which case the harmonic tuning becomes uncontrollable.

In a first preferred embodiment of the invention shown in FIGS. 8 and 12a, 12b and 12c, the means 23 for rejecting at least one harmonic frequency include a transmission line 16, each end of which is preferably provided with RF connectors 6 and 7 (not shown). The transmission line can be a slotted coaxial airline or a parallel-plate airline (slabline), or any other appropriate transmission line. Air is preferably used as the transmission media in order to reduce transmission losses, and the transmission line could include support studs for the central conductor (not shown).

Figure 8:
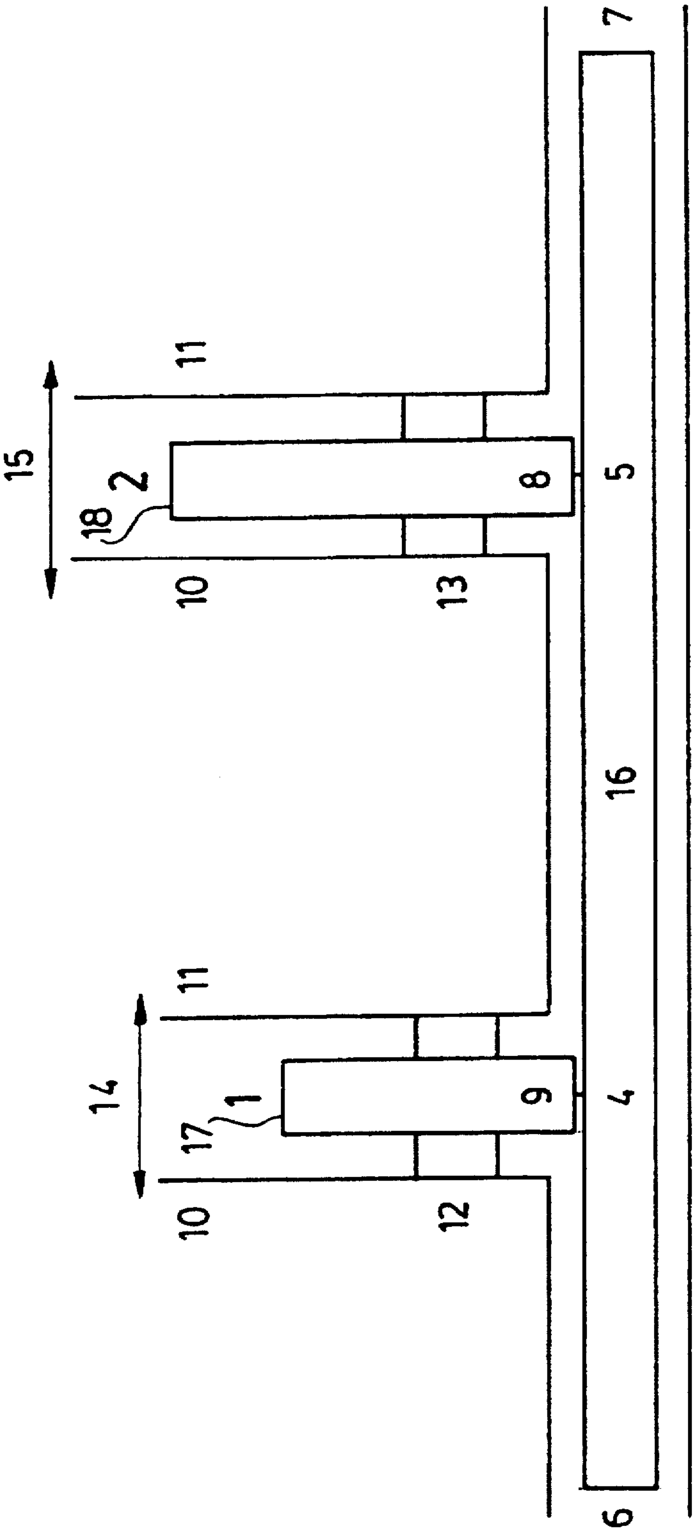
FIG. 8 is a schematic cross-sectional view of the means for rejecting at least one harmonic frequency for use with the harmonic rejection load pull tuner of FIG. 7, according to a preferred embodiment thereof.

The means 23 further include at least one stub, although FIGS. 8 and 12 show two stubs 1 and 2. Each stub 1, 2 has a length adapted to reflect out an nth order harmonic frequency, where n is an integer greater than 1. It should be understood that the present invention is not limited to one stub. In fact, as will be further detailed, one or more single or double stubs can be used to reflect out $2^{nd}$, $3^{rd}$, $4^{th}$, etc., harmonics, individually or in combination. In the preferred embodiment of the invention, two stubs are used to reflect out $2f^{o}$ and $3f_o$, although for some purposes, only $2f_o$, $3f_o$, or $4f_o$, etc., can be reflected out, depending on the characteristics of the DUT.

The stubs 1, 2 each comprise a central conductor 17, 18 and are surrounded by circular, rectangular or parallel plate side walls 10 and 11, and form an open ended resonator (an open line resonator), which is preferably a coaxial resonator. Conductors 17 and 18 are permanently secured on the side walls 10 and 11 through dielectric, low loss washers 12 and 13, in order to be able to move the conductors 17 and 18 along the longitudinal axis of the transmission line 16 without changing the structure and configuration of stubs 1 and 2 made of conductors 17 and 18 and side walls 10 and 11.

The length of conductors 17 and 18 is selected to be $\lambda/4$ at the selected harmonic frequency ($2f_o$, $3f_o$, etc.). However, it should be understood that the length could be three quarter, five quarter, etc. wavelength, which is more practical at higher frequencies.

The stubs are moveable along the longitudinal axis of the transmission line 16, as shown by arrows 14 and 15. An appropriate hand or motor driven mechanism ensures the controlled smooth travel of the stubs 1 and 2 along the longitudinal axis of the transmission line 16, and thus the control of the phase of the reflection factor generated by the stubs 1 and 2. The purpose is to be able to present high reflection factors to harmonic frequencies in a selective manner, which does not affect in a material way the tuning at the fundamental frequency. More specifically, the phase shift introduced by a stub tuned at a given harmonic frequency can be adjusted independently of the phase shift introduced by another stub tuned at another harmonic frequency.

It will be understood by a person skilled in this field that important issues surrounding the efficiency of the present invention are low loss stubs; a "perfect" ground for the set-up; and a good sliding contact between conductors 17 and 18 and the central conductor in the transmission line 16.

Figure 11A:
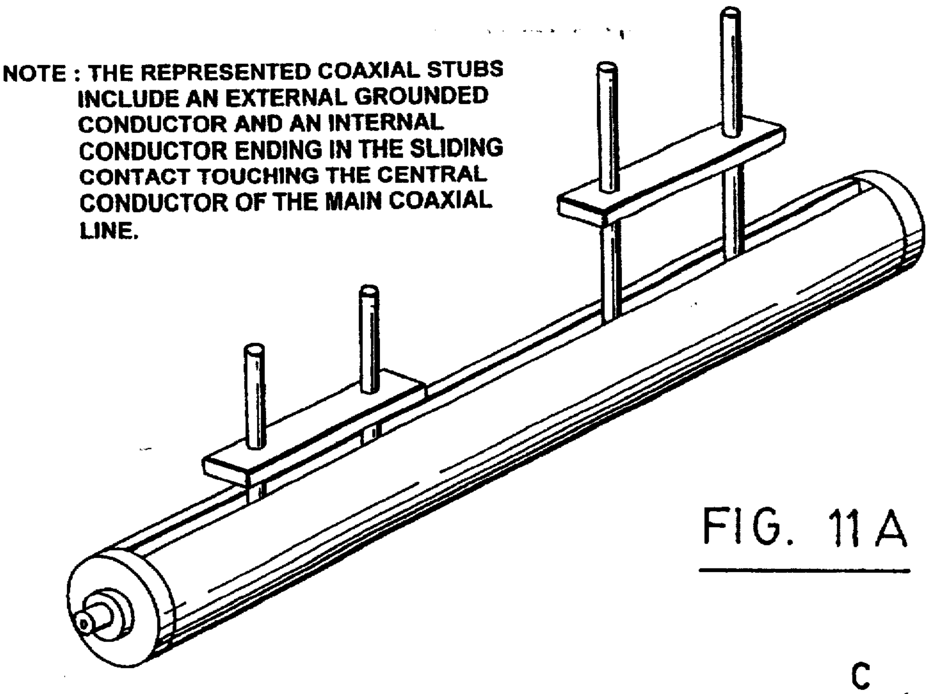
FIGS. 11a, 11b and 11c are respectively front perspective; schematic longitudinal and cross sectional views of the means for rejecting at least one harmonic frequency illustrated in FIG. 9.
Figure 11B:
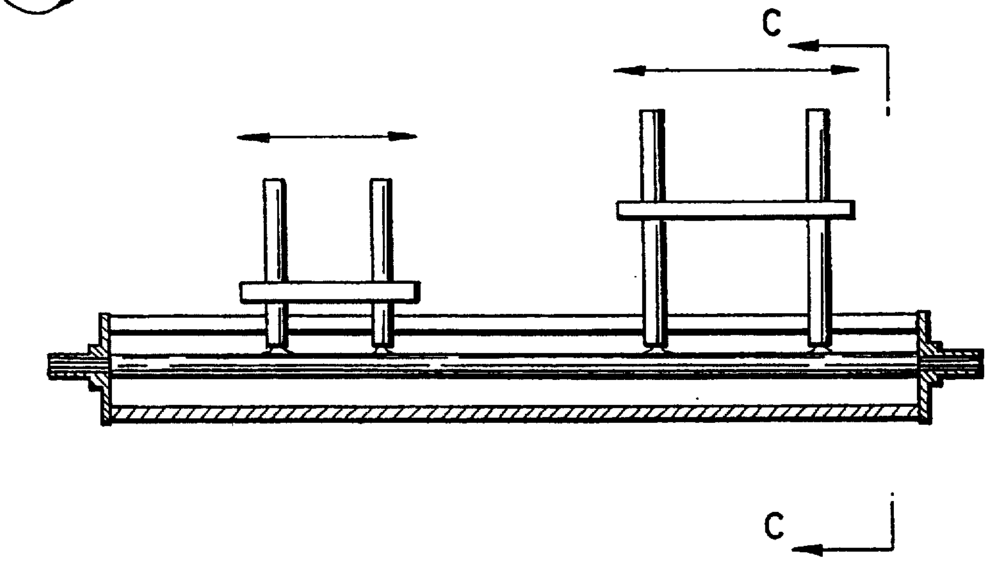
Figure 11C:
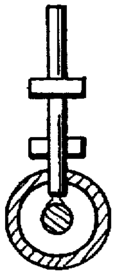
Figure 12A:
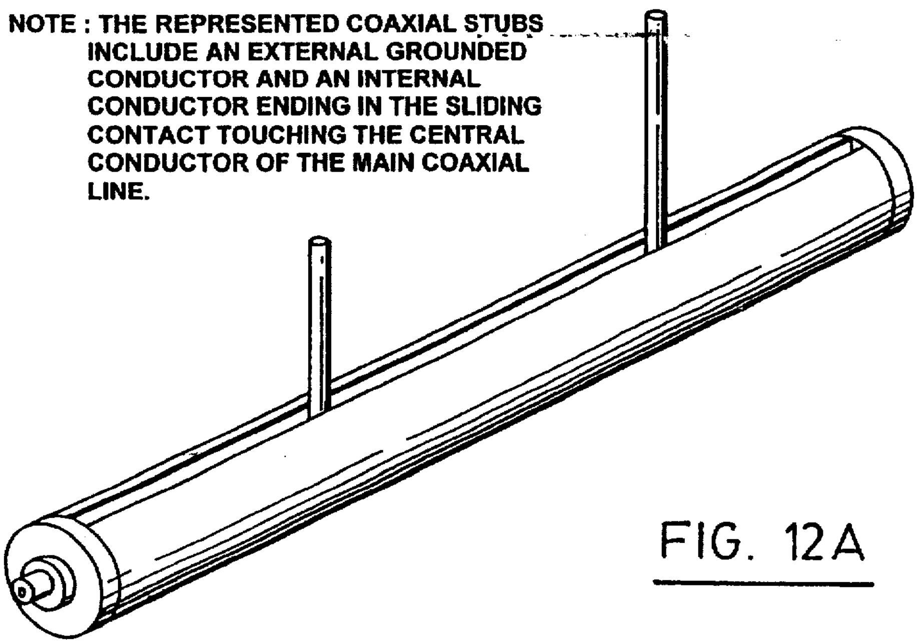
FIGS. 12a, 12b and 12c are respectively front perspective; schematic longitudinal and cross-sectional views of the means for rejecting at least one harmonic frequency illustrated in FIG. 8.
Figure 12B:
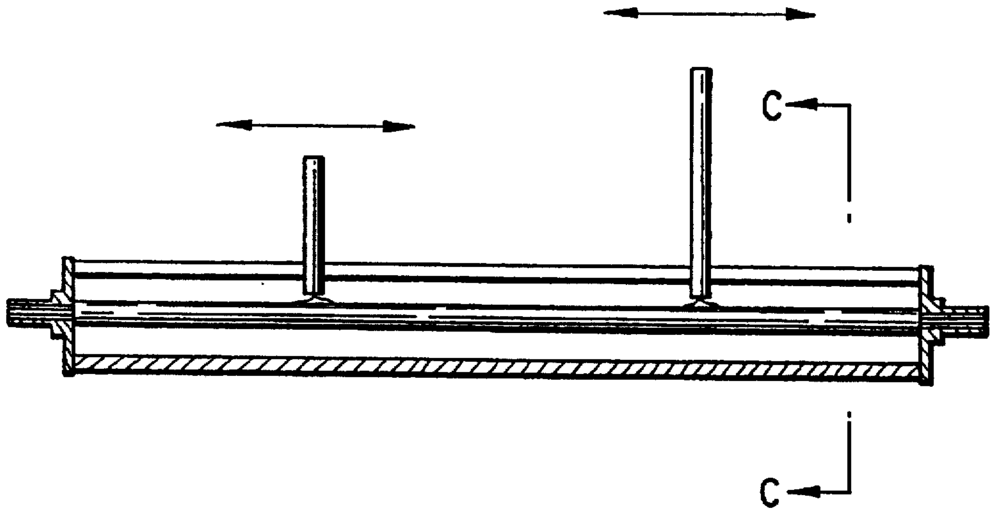
Figure 12C:
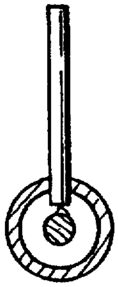

In a preferred embodiment of the invention, the sliding contact is achieved with elastic beryllium copper foil which is outwardly pre-bent such as to slide on the top of the central conductor and ensure "perfect" galvanic contact (see FIGS. 11*b* and 12*b*). This minimizes the losses and increases the band rejection.

Accordingly, in order to perform characterisation of a DUT, a signal at a fundamental frequency is injected into the set-up of FIG. 7. The stubs are then positioned along the transmission line to control the phase. Afterwards, large band tuning can be performed, without having any impact from the harmonic frequencies. It should be however understood that movement of the stubs is not made only prior to large band tuning, but can be made during large band tuning, in order to optimise be phase.

Figure 9:
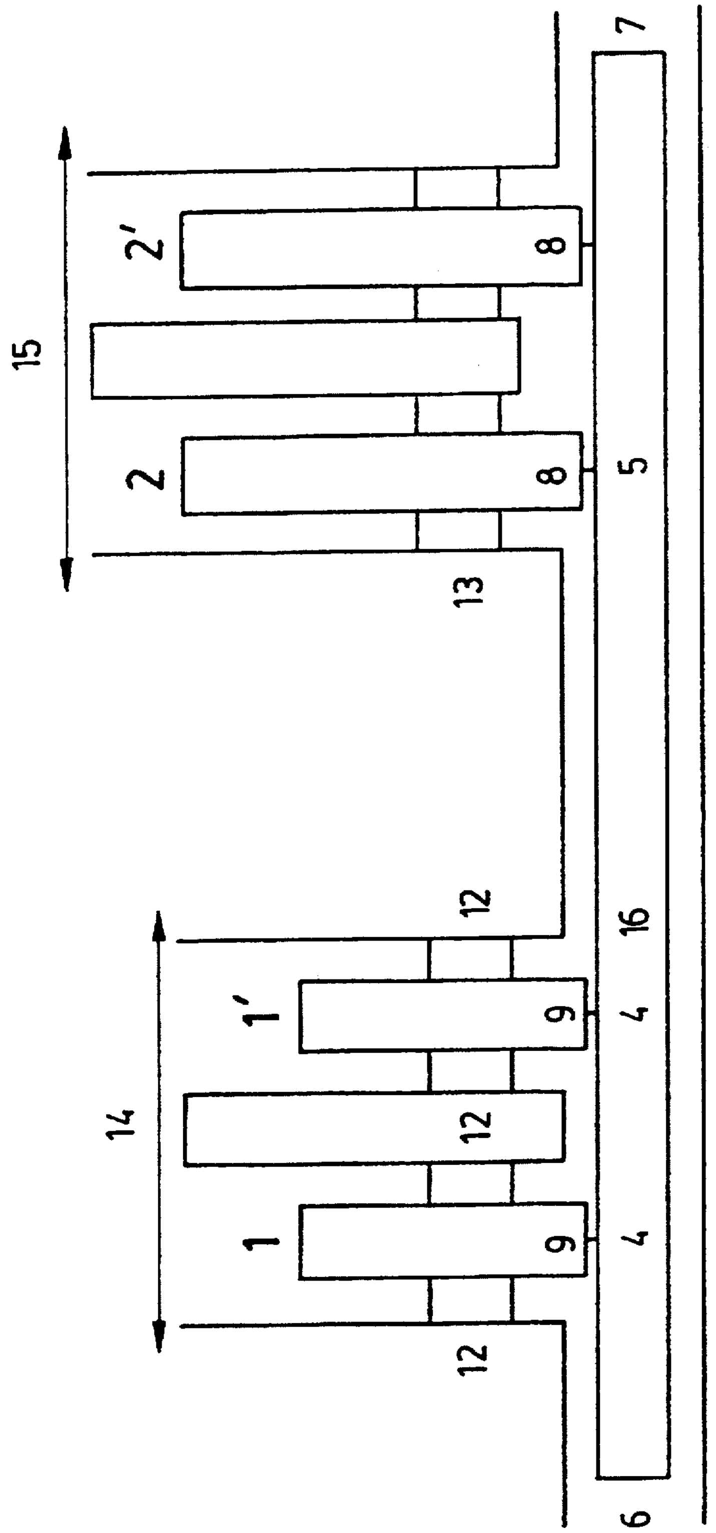
FIG. 9 is a schematic cross-sectional view of the means for rejecting at last one harmonic frequency for use with the harmonic rejection load pull tuner of FIG. 7, according to another preferred embodiment thereof.
Figure 10A:
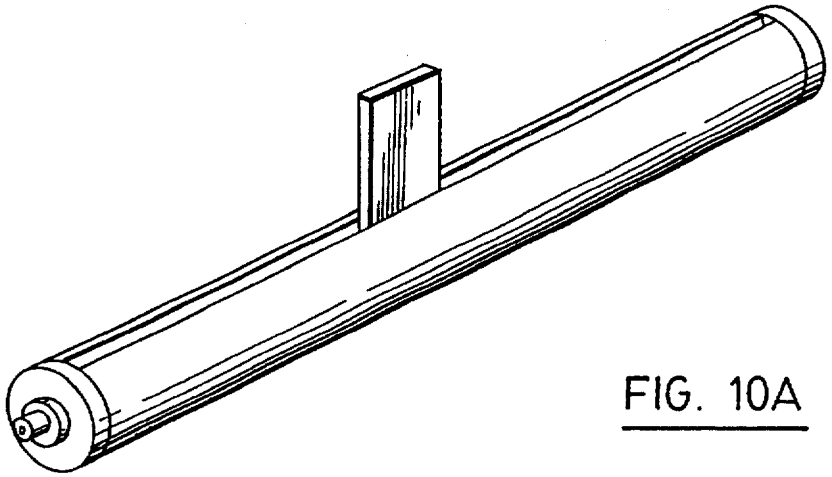
FIGS. 10a, 10b and 10c are respectively front perspective; schematic longitudinal and cross-sectional views of a typical large-band tuner according to the prior art.
Figure 10B:
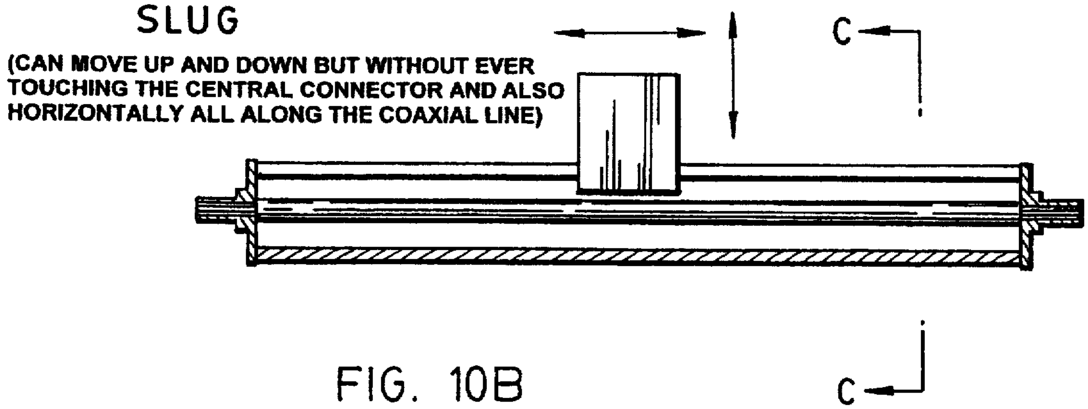
Figure 10C:
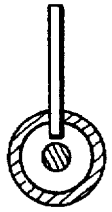

Although the configuration of FIG. 8 has proven to be successful in reflecting out the second and third harmonics, a second preferred embodiment of the invention provides for a secondary resonator to be placed at a predetermined distance from each of the stubs 1 and 2 (i.e. a double stub), respectively, or only for one of the stubs, in order to compensate for the residual reflection. As shown in FIG. 9, stub 1 is accompanied by resonator 1', and stub 2 is accompanied by resonator 2'. It should be noted that the configuration of resonators 1' and 2' is preferably identical to the configuration of stubs 1 and 2. In order that the resonators 1' and 2' eliminate the residual reflection, they are preferably mechanically attached to the corresponding stub (see FIG. 11), and they will be moved longitudinally together when moving stubs 1 and 2 independently to adjust the phase. The distance between stub 1 and resonator 1', and between stub 2 and resonator 2' is $\lambda/4$ at $f_o$. Although stubs 1 and 2 are shown with respective resonators 1' and 2', it will be recognized that depending on the importance of the harmonic frequency one wishes to reflect out, the stubs can be accompanied by one or more resonators, each spaced by a distance of $\lambda/4$ at $f_o$. For example, assume that the most problematic harmonic frequencies are the $2^{nd}$ and $4^{th}$, the $2^{nd}$ having a much greater impact than the $4^{th}$. A first stub can be accompanied by a first resonator (or two, or three, . . . ), to reflect out as "perfectly" as possible the $2^{nd}$ harmonic. However, since the $4^{th}$ harmonic does not have as great an impact, only one stub, without any resonators, can be used to reflect out the $4^{th}$ harmonic.

Figure 13:
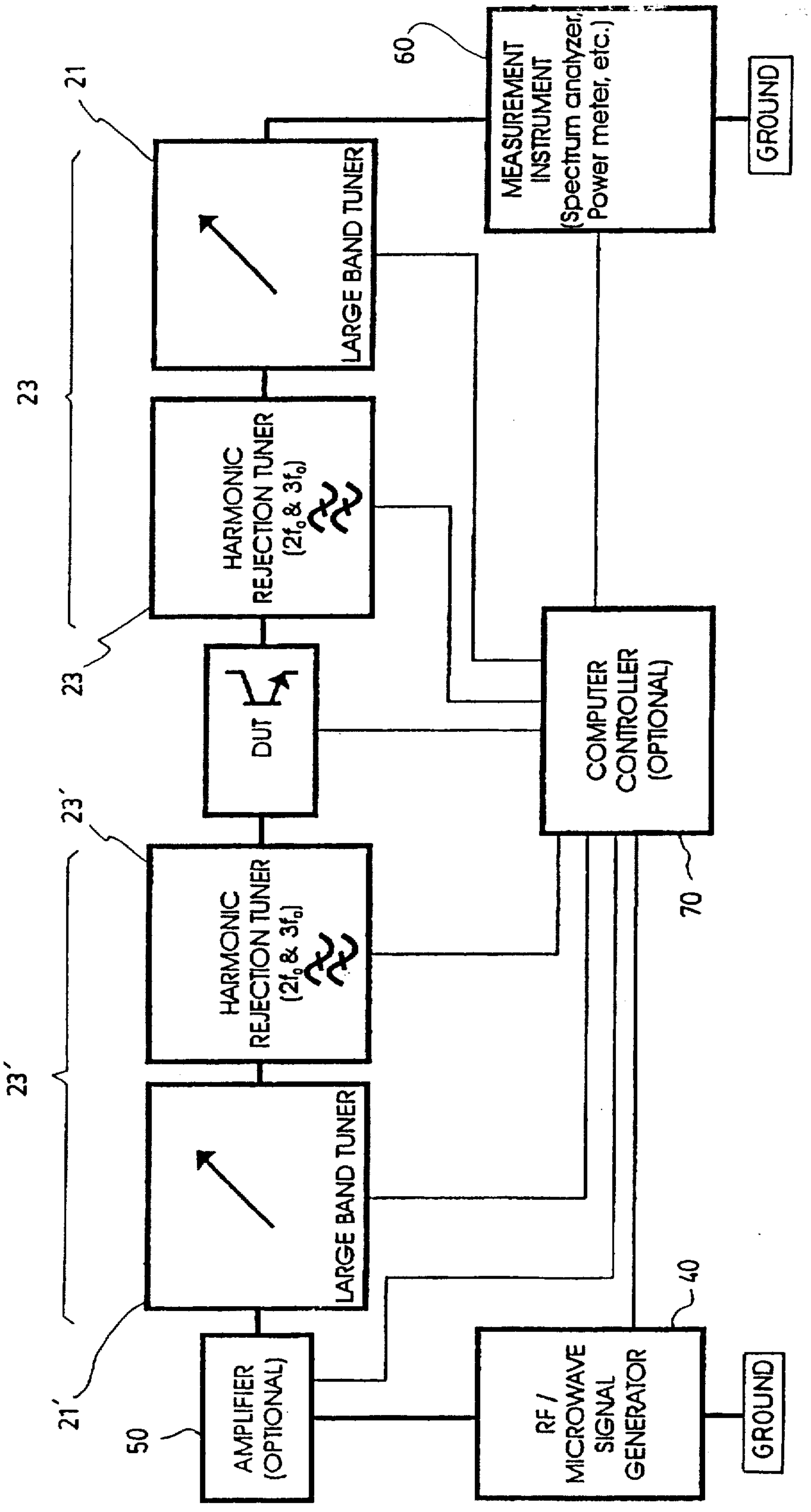
FIG. 13 is a schematic representation of an alternative embodiment of the invention, where both input and output characterisation can be performed.

It should also be understood that the present invention is not only applicable to output characterisation (shown in FIG. 7), but could also be used for input characterisation (FIG. 13), or both at the same time. If the present invention is used for input characterisation, as mentioned previously, the means 23 must be placed between the input large-band tuner and the DUT, as shown in FIG. 13.

It should also be understood that when the fundamental frequency changes, the length of each of the stubs is changed to reflect out the desired harmonic frequencies of the new fundamental frequency. This is true for important variations of the base frequency (in the order of a few percent) which entails that the length of each of the stubs must be changed accordingly. For minor variations of the base frequency, a slight degradation of the performance and precision of the set-up can be expected.

Practically however, the harmonic rejection load pull tuner of the present invention will be supplied as a kit with a plurality of stubs. Each stub will have a length adapted to reflect out an nth order harmonic of a given frequency $f_k$. As such, should a person wish to perform characterisation (input or output or both) of a DUT for a range of frequencies $f_1$, to $f_k$, a kit can be supplied which includes a plurality of stubs, each with a length adapted to reflect out $nf_k$. As mentioned previously, for minor variations of the base frequency $f_k$, a slight degradation can be expected. In practice, a stub tuned to a particular frequency will be used to perform characterisation for a range of frequencies $f_k \pm \Delta f$. Consequently, numerous stubs for each discrete frequency in the range $f_1$ to $f_k$ are not necessary. Alternatively, stubs having a variable length (e.g. where the length of the stub is varied with a plunger attached to a screw) can be used to increase $\Delta f$, and thus further reduce the number of stubs necessary This, it will be recognized, will however be accompanied by a decrease in the precision of the measurements, because of the difficulty in precisely adjusting the position of the plunger with the screw.

It should also be readily recognized that if a computer is used to control the signal generator, the large-band tuner and the stubs 1 and 2, a calibration must be performed prior to using the set-up.

Finally, expressions such as "perfects", "equal" and "identical" have been used in the present description and in the following claims. However, it will be understood that these expressions, and other like them, are used in the context of theoretical calculations, but in practice mean "as close as possible" to the theory.

Although the present invention has been explained hereinabove by way of a preferred embodiment thereof, it should be pointed out that any modifications to this preferred embodiment within the scope of the appended claims is not deemed to alter of change the nature and scope of the present invention.

What is claimed is:

1. A harmonic rejection load pull tuner comprising:
   a large-band tuner having an input and an output; and
   means for reflecting at least one harmonic frequency of a base frequency, said means having an input and an output, said input being connected to an output of a device under test (DUT) and said output being connected to the input of said large-band tuner, said means for reflecting at least one harmonic frequency comprising:
      a transmission line having a longitudinal axis; and
      at least one stub in parallel with said transmission line, said stub being galvanically connected to said transmission line and having a length adapted to reflect out an nth order harmonic of a base frequency, where n is an integer greater than 1.

2. A harmonic rejection load pull tuner according to claim 1, wherein said at least one stub is moveable.

3. A harmonic rejection load pull tuner according to claim 2, wherein said means for reflecting at least one harmonic frequency include two moveable stubs, each of said stubs being in parallel with said transmission line and longitudinally spaced apart from each other, a first stub having a length adapted to reflect out a second order harmonic and a second stub having a length adapted to reflect out a third order harmonic.

4. A harmonic rejection load pull tuner according to claim 2, wherein said transmission line is a coaxial line.

5. A harmonic rejection load pull tuner according to claim 2, wherein said at least one moveable stub has a length approximately equal to $\lambda/4$ at $nf_o$.

6. A harmonic rejection load pull tuner according to claim 2, wherein said at least one moveable stub is a coaxial resonator.

7. A harmonic rejection load pull tuner according to claim 2, wherein at least one of said at least one moveable stub further includes another resonator adapted to compensate the effect of the corresponding moveable stub on the reflection factor at the fundamental frequency, said other resonator having a configuration identical to the corresponding moveable stub and being mechanically attached thereto.

8. A method for performing output characterization of a device under test (DUT), where said DUT has an input and an output, comprising the steps of:

(a) inputting a signal into the input of the DUT with a signal generator;

(b) outputting the output of the DUT into means for reflecting out at least one harmonic frequency of a base frequency where said means comprise a transmission line and at least one stub having a length adapted to reflect out the at least one harmonic frequency;

(c) outputting an output of said means into a large band tuner; and (d) measuring the output of said large band tuner.

9. A harmonic rejection load pull tuner comprising:

a large-band tuner having an input and an output, said input being connected to the output of a signal generator;

means for reflecting at least one harmonic frequency of a base frequency, said means having an input and an output, said input being connected to the output of said large-band tuner, and said output being connected to an input of a device under test (DUT), where said means for reflecting at least one harmonic frequency include: a transmission line having a longitudinal axis; and at least one stub in parallel with said transmission line, said stub being galvanically connected with the longitudinal axis and having a length adapted to reflect out an nth order harmonic of a base frequency, where n is an integer greater than 1.

10. A harmonic rejection loan pull tuner according to claim 9, wherein said means for reflecting at least one harmonic frequency include two moveable stubs, each of said stubs being in parallel with said transmission line and longitudinally spaced apart from each other, a first stub having a length adapted to reflect out a second order harmonic and a second stub having a length adapted to reflect out a third order harmonic.

11. A harmonic rejection load pull tuner according to claim 9, wherein said transmission line is a coaxial line.

12. A harmonic rejection load pull tuner according to claim 9, wherein said at least one moveable stub has a length approximately equal to $\lambda/4$ at $nf_o$.

13. A harmonic rejection load pull tuner according to claim 9, wherein said at least one moveable stub is a coaxial resonator.

14. A harmonic rejection load pull tuner according to claim 9, wherein at least one of said at least one moveable stub further includes another resonator adapted to compensate the effect of the corresponding moveable stub on the reflection factor at the fundamental frequency, said other resonator having a configuration identical to the corresponding moveable stub and being mechanically attached thereto.

15. A harmonic rejection load pull tuner according to claim 9, further comprising:

another large-band tuner having an input and an output, said input being connected to the output of said signal generator; and another means for reflecting at least one harmonic frequency of a base frequency, said other means having an input and an output, said input being connected to the output of said other large-band tuner, and said output being connected to the input of said DUT.

16. A method for performing input characterization of a device under test (DUT), where said DUT has an input and an output, comprising the steps of:

(a) inputting a signal into a large-band tuner, (b) outputting the output of the large-band tuner into means for reflecting out at least one harmonic frequency of a base frequency including a transmission line and at least one moveable stub for reflecting out at least one harmonic frequency, said stub being galvanically connected with the longitudinal axis;

(c) outputting the output of the means into the input of the DUT; and (d) measuring the output of said DUT.

* * * * *

UNITED STATES PATENT AND TRADEMARK OFFICE
CERTIFICATE OF CORRECTION

PATENT NO. : 6,297,649 B1
DATED : October 2, 2001
INVENTOR(S) : Tsironis, Christos It is certified that error appears in the above-identified patent and that said Letters Patent is hereby corrected as shown below:

Title page, Item [54] and Column 1, line 1,
Title, change "HARMONIC REJECTION LOAD TURNER " to
-- HARMONIC REJECTION LOAD PULL TURNER --.

Signed and Sealed this

Twenty-sixth Day of November, 2002

*Attest:*

JAMES E. ROGAN

*Attesting Officer*

*Director of the United States Patent and Trademark Office*

UNITED STATES PATENT AND TRADEMARK OFFICE

CERTIFICATE OF CORRECTION

PATENT NO. : 6,297,649 B1
DATED : October 2, 2001
INVENTOR(S) : Tsironis, Christos It is certified that error appears in the above-identified patent and that said Letters Patent is hereby corrected as shown below:

Title page, Item [54] and Column 1, line 1,
Title, change "HARMONIC REJECTION LOAD TUNER" to
-- HARMONIC REJECTION LOAD PULL TUNER --.

This certificate supersedes Certificate of Correction issued November 26, 2002.

Signed and Sealed this

Tenth Day of August, 2004

JON W. DUDAS
*Acting Director of the United States Patent and Trademark Office*